United States Patent
Xu et al.

(10) Patent No.: US 10,141,254 B1
(45) Date of Patent: Nov. 27, 2018

(54) DIRECT BONDED COPPER POWER MODULE WITH ELEVATED COMMON SOURCE INDUCTANCE

(71) Applicant: FORD GLOBAL TECHNOLOGIES, LLC, Dearborn, MI (US)

(72) Inventors: Zhuxian Xu, Novi, MI (US); Chingchi Chen, Ann Arbor, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 0 days.

(21) Appl. No.: 15/978,552

(22) Filed: May 14, 2018

(51) Int. Cl.
| | |
|---|---|
| H01L 23/52 | (2006.01) |
| H01L 23/498 | (2006.01) |
| H01L 25/18 | (2006.01) |
| H01L 23/64 | (2006.01) |
| H02M 7/00 | (2006.01) |
| H02K 11/33 | (2016.01) |
| H01L 23/367 | (2006.01) |
| H01L 23/00 | (2006.01) |

(52) U.S. Cl.
CPC .... *H01L 23/49838* (2013.01); *H01L 23/3675* (2013.01); *H01L 23/49833* (2013.01); *H01L 23/645* (2013.01); *H01L 25/18* (2013.01); *H02K 11/33* (2016.01); *H02M 7/003* (2013.01); *H01L 24/48* (2013.01); *H01L 2224/48225* (2013.01)

(58) Field of Classification Search
CPC ............ H01L 23/3735; H01L 2224/83; H01L 2224/197; H01L 2224/3147; H01L 24/97
USPC .............. 257/723, 724, 762, 686, 691, 777
See application file for complete search history.

(56) References Cited

U.S. PATENT DOCUMENTS

| | | | |
|---|---|---|---|
| 7,429,779 B2 | 9/2008 | Itoi et al. | |
| 8,703,560 B2 | 4/2014 | Miyairi et al. | |
| 9,813,009 B1 | 11/2017 | Xu et al. | |
| 2005/0152100 A1* | 7/2005 | Rodriguez | ............ H02M 7/003 361/605 |
| 2007/0290311 A1* | 12/2007 | Hauenstein | ......... H01L 23/3735 257/685 |
| 2013/0328200 A1 | 12/2013 | Bae | |
| 2016/0240470 A1* | 8/2016 | Wu | ..................... H01L 27/0883 |

(Continued)

FOREIGN PATENT DOCUMENTS

CN 103367305 A 10/2013

OTHER PUBLICATIONS

Shen, Z et al., Power Semiconductor Devices for Hybrid, Electric, and Fuel Cell Vehicles, Proceedings of the IEEE (2007), 95, 778-789.

(Continued)

*Primary Examiner* — Sheila V. Clark
(74) *Attorney, Agent, or Firm* — David B. Kelley; MacMillan, Sobanski & Todd, LLC

(57) ABSTRACT

A direct bonded copper (DBC) power module with elevated common source inductance is adapted for use as a half bridge in an electric drive for an electric vehicle. Etching patterns on the DBC substrates provide indented notches for concentrating magnetic flux in the power loops. Etched gate traces form gate loops with coil windings disposed within or overlapping the notches in order to enhanced the common source inductance for each switching transistor (such as an IGBT). Switching loss is reduced and fuel economy is improved for the electric vehicle with minimal impact on packaging size and at no additional cost.

20 Claims, 10 Drawing Sheets

(56) References Cited

U.S. PATENT DOCUMENTS

| | | | |
|---|---|---|---|
| 2017/0062386 A1* | 3/2017 | Wang | H01L 24/08 |
| 2017/0064808 A1* | 3/2017 | Rizza | H01L 23/24 |
| 2017/0287875 A1* | 10/2017 | Gao | H01L 23/3107 |
| 2018/0056795 A1 | 3/2018 | Xu et al. | |

OTHER PUBLICATIONS

Li Shengnan, Packaging Design of IGBT Power Module Using Novel Switching Cells. PhD Diss, University of Tennessee, 2011— http://trace.tennessee.edu/utk_graddiss/1205.

* cited by examiner

DIRECT BONDED COPPER POWER MODULE WITH ELEVATED COMMON SOURCE INDUCTANCE

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to power switching modules for half-bridge inverters, and, more specifically, to inverter drive systems for electrified vehicles wherein the power switching modules in the inverter employ enhanced common source inductance to obtain high switching efficiency.

Electric vehicles, such as hybrid electric vehicles (HEVs), plug-in hybrid electric vehicles (PHEVs), and battery electric vehicles (BEVs), use inverter-driven electric machines to provide traction torque to the wheels. A typical electric drive system may include a DC power source (such as a battery pack or a fuel cell) coupled by contactor switches to a variable voltage converter (VVC) to regulate a main bus voltage across a main DC linking capacitor. An inverter is connected between the main buses and a traction motor in order to convert the DC bus power to an AC voltage that is coupled to the windings of the motor to propel the vehicle.

The inverter includes transistor switching devices (such as insulated gate bipolar transistors, IGBTs) connected in a bridge configuration with a plurality of phase legs. Each phase leg is constructed as a half bridge with a high-side transistor connected in series with a low-side transistor between the DC buses. A typical configuration includes a three-phase motor driven by an inverter with three phase legs. An electronic controller turns the switches on and off in order to invert a DC voltage from the bus to an AC voltage applied to the motor. The inverter may pulse-width modulate the DC link voltage in order to deliver an approximation of a sinusoidal current output to drive the motor at a desired speed and torque. Pulse Width Modulation (PWM) control signals applied to the gates of the IGBTs turn them on and off as necessary so that the resulting current matches a desired current.

Semiconductor switching devices such as an IGBT or a MOSFET are driven at a gate terminal by a gate signal provided by a driver circuit. For an IGBT, the gate signal is applied between the gate terminal and an emitter terminal of the device. In the ON state, an output signal is conducted through the device between a collector terminal and the emitter terminal. Device current flows in a gate loop and in a power loop.

Common source inductance refers to an inductance shared by the main power loop (i.e., the drain-to-source or collector-to-emitter power output of the transistor) and the gate driver loop (i.e., gate-to-source or gate-to-emitter) in a power switching transistor. The common source inductance carries both the device output current (e.g., drain to source current) and the gate charging/discharging current. A current in the output (power loop) portion of the common source inductance modifies the gate voltage in a manner that reinforces (e.g., speeds up) the switching performance. As disclosed in co-pending U.S. application Ser. No. 15/341,184, entitled "Inverter Switching Devices with Common Source Inductance Layout to Avoid Shoot-Through," filed Nov. 2, 2016, and hereby incorporated by reference, the reduced switching time may be desirable since it may have an associated reduction in the energy consumed (i.e., lost) during the switching transition. The magnitude of the gate loop inductance and/or the power loop inductance and the degree of mutual coupling between them can be manipulated (e.g., enhanced) by selecting an appropriate layout and/or including added overlapping coils in PCB traces forming conductive paths to the transistor gates or emitters in order to obtain a desired common source inductance.

The transistor switching devices and associated components (such as a reverse diode across each transistor) are often packaged in a power module. One typical configuration uses direct bond copper (DBC) substrates having a copper layer with etched circuit patterns which receive transistor and diode dies. After adding bonded jumper wires, terminal pins, and conductive spacers, a module containing two DBC substrates may be encapsulated in an overmolded plastic body.

A power module for use in vehicle electric drive systems must satisfy stringent requirements concerning reliability, efficiency, durability, and cost. Another important consideration is packaging size. When adding structures or components to increase the common source inductance between the gate loop and power loop, the packaging size for a power module has been increased. Thus, it would be desirable to increase common source inductance without significant increase in components or packaging space.

SUMMARY OF THE INVENTION

In one aspect of the invention, a half-bridge power module comprises a first direct bonded copper substrate (DBC) with a first insulation layer, a first etched circuit layer on an inner surface, and a first heat transfer layer on an outer surface. The first etched circuit layer includes a high-side plate with a high-side terminal pad. A second direct bonded copper substrate (DBC) is provided with a second insulation layer, a second etched circuit layer on an inner surface, and a second heat transfer layer on an outer surface. The second etched circuit layer includes an output plate with a output terminal pad. A high-side transistor die has a collector side soldered to the high-side plate. A low-side transistor die having a collector side soldered to the output plate. The high-side plate defines a first indented notch disposed between the high-side transistor die and the high-side terminal pad to concentrate a magnetic flux at the first indented notch induced by a current in the high-side plate. One of the first or second etched circuit layers further includes a high-side gate trace connected to the high-side transistor die and overlapping the first indented notch.

DETAILED DESCRIPTION OF PREFERRED EMBODIMENTS

Figure 1:
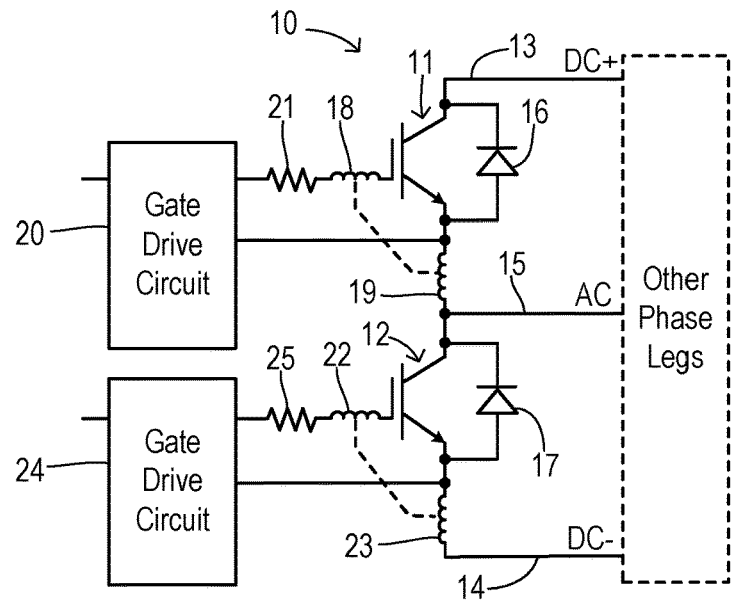
FIG. 1 is a schematic diagram showing a prior art equivalent circuit for a phase leg of an inverter having a pair of IGBTs each of which exhibits a common source inductance.

Common source inductance is an inductance shared by a main power loop and a gate driver loop for a transistor switching device. It usually arises from parasitic inductances associated with the device packaging and traces on printed circuit boards. In the context of switching bridges used for DC to AC power conversion, the presence of common source inductance can be beneficial. FIG. 1 shows an example of a half-bridge phase leg 10 of the type often used in an inverter drive system in an electrified vehicle for driving an electric motor, wherein a high-side (i.e., upper) transistor 11 is shown as an IGBT with upper gate, collector, and emitter terminals. Other types of semiconductor devices could be used, such as a MOSFET. As used herein, the gate, collector, and emitter terminals of an IGBT also refer to gate, drain, and source terminals of a MOSFET. A low-side (i.e., lower) transistor 12 having lower gate, collector, and emitter terminals is connected in series with upper transistor 11 between a positive bus 13 and a negative bus 14 to define an intermediate (i.e., output) junction 15. Buses 13 and 14 provide a DC link that receives a DC supply voltage from a DC power supply (e.g., battery) via a variable voltage converter (not shown). Anti-parallel diodes 16 and 17 are connected across transistors 11 and 12.

The upper gate and emitter terminals create an upper common source inductance comprised of a gate loop inductance 18 magnetically coupled to a power loop (i.e., emitter-side) inductance 19. A gate drive circuit 20 and a gate resistor 21 are coupled to the gate terminal in order to control the switching of upper transistor 11. The lower gate and emitter terminals create a lower common source inductance comprised of a gate loop inductance 22 magnetically coupled to a power loop inductance 23. A gate drive circuit 24 and a gate resistor 25 are coupled to the gate terminal in order to control the switching of lower transistor 12. By carefully adjusting the magnitude of the common source inductances, a favorable impact is obtained on the switching times and energy loss associated with switching the devices on and off.

Direct Bonded Copper (DBC) substrates have been used to construct a power card or power module having semiconductor devices connected to form a phase leg. A typical DBC substrate includes a ceramic layer with two metallization layers on opposite sides. The metallization layer on one side provides a heat sink. The layer of the other side is etched to form circuit plates/traces and bonding pads, wherein the semiconductor devices, spacers, and various bonding wires are soldered/bonded onto the plates and pads. The power module may further include a lead frame with multiple input/output pins and an overmolded body encapsulating the module.

Figure 2:
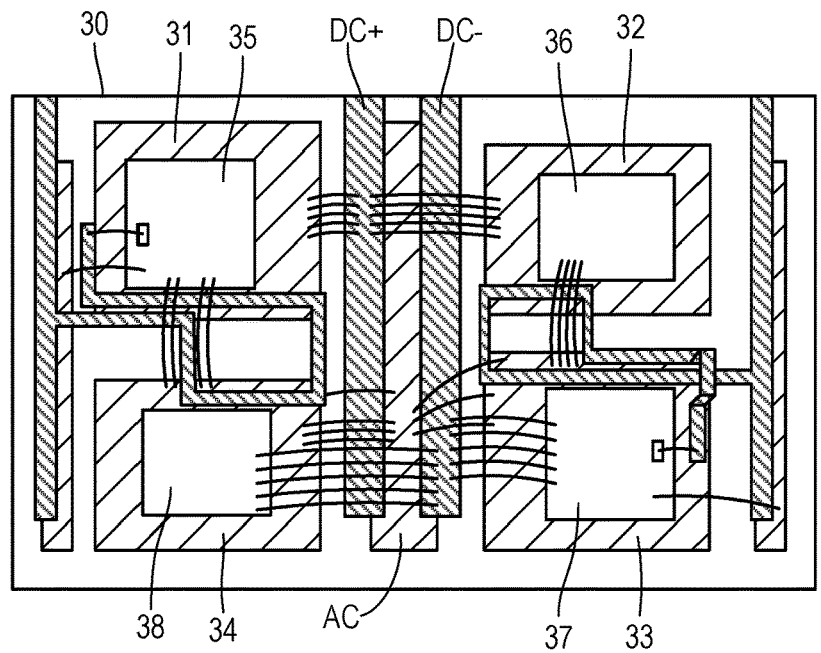
FIG. 2 is a diagram showing a prior art layout of IGBTs and diodes in a 2-in-1 power module for a phase leg using gate coils for enhancing the common source inductance.
Figure 3:
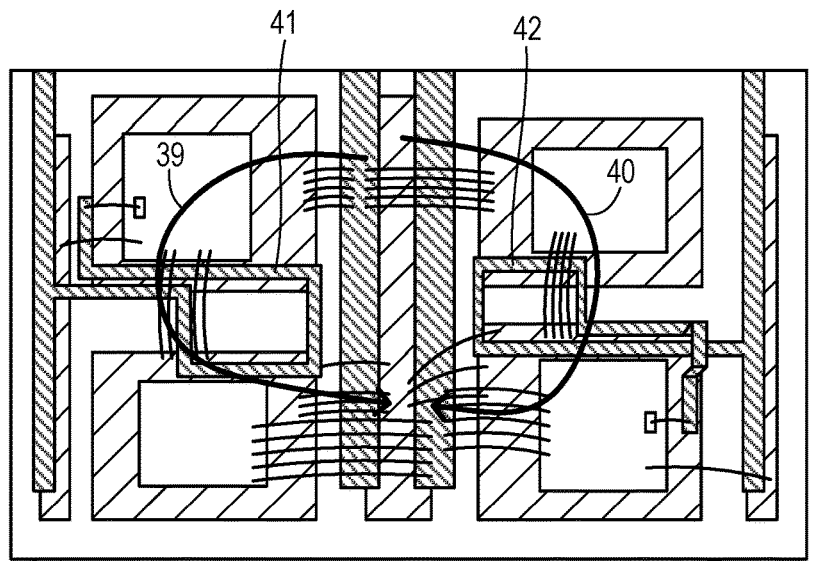
FIG. 3 is an annotation of the diagram of FIG. 2 showing the overlapping of power loop current flow with the gate coils.

FIG. 2 shows a power module substrate as disclosed in U.S. application Ser. No. 15/341,184. A power module DBC substrate 30 carries a plurality of conductive layers, wherein the conductive layers define a positive rail (i.e., trace) DC+ and a negative rail DC− arranged between first and second mounting regions. For example, rails DC+ and DC− together with an output rail AC may be arranged to bisect a surface of substrate 30, providing first and second mounting regions on opposite sides of the rails. Separate conductive pads 31, 32, 33, and 34 are provided for upper IGBT 35, upper diode 36, lower IGBT 37, and lower diode 38, respectively. Thus, upper IGBT 35 and lower diode 38 are mounted in the first mounting region, and lower IGBT 37 and upper diode 36 are mounted in the second mounting region. The IGBTs are comprised of transistor dies, and their collector side is preferably soldered directly to pads 31 and 33, for example. Gate loops are be included for each IGBT in its respective mounting region, but since the anti-parallel diode for each respective IGBT is in the opposite mounting region, the added common source inductance couples substantially only to its own power loop. More specifically, FIG. 3 shows an upper power loop 39 and a lower power loop 40. Each diode bypasses the common source inductance of its matching transistor. In addition, a gate trace 41 for upper IGBT 35 forms a gate coil which coincides with upper power loop 39, and a gate trace 42 for lower IGBT 37 forms a gate coil which coincides with lower power loop 40. The size and position of the gate coils is selected to produce a desired amount of common source inductance.

Figure 4:
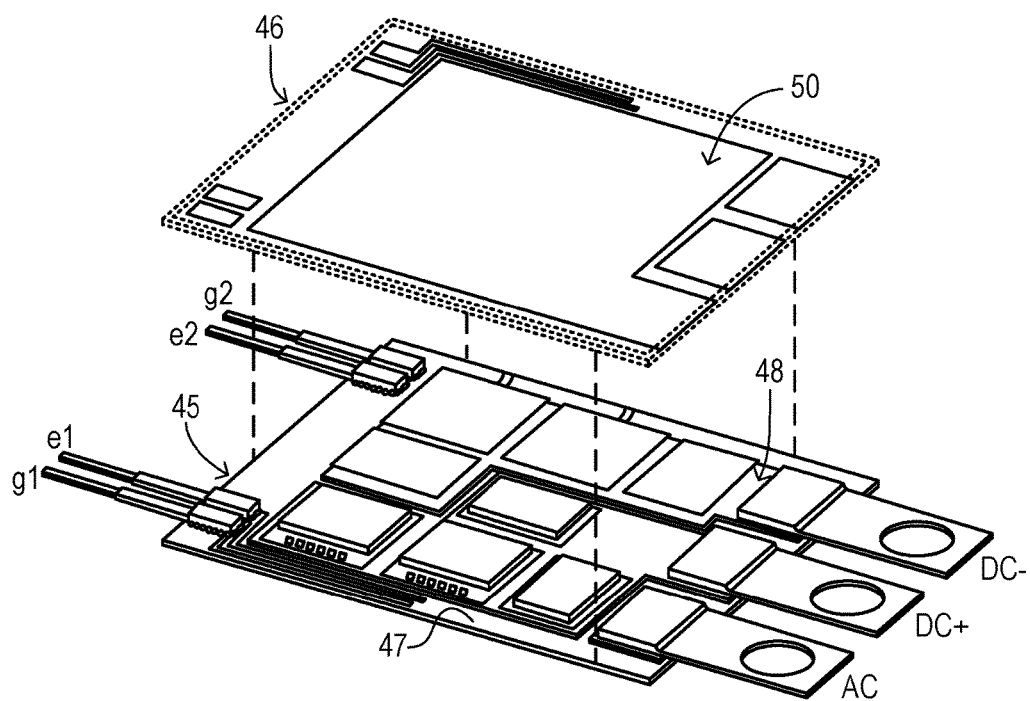
FIG. 4 is an exploded, perspective view showing an example layout for a half-bridge power module using two parallel transistors each for switching the high-side and low-side of the half bridge, wherein common source inductance is not enhanced.

FIG. 4 shows another embodiment of a power module using two DBC substrates and using a pair of parallel IGBTs for both the high-side and low-side switching in order to double the current carrying capacity. The anti-parallel diodes are also doubled in order to handle the increased current. A first DBC substrate 45 includes an insulating layer 46 with a shaped (e.g., etched) bonded copper layer 48 on one (internal) surface for providing a circuit pattern and a continuous bonded copper layer (not shown) on the other (external) side surface for providing increased heat transfer. A second DBC substrate 46 has an insulating layer and an external heat transfer layer (both shown in phantom) and a copper layer 50 for providing additional portions of the circuit pattern and terminal pads. One half of the IGBTs/ diodes (e.g., the high-side devices) have one side directly soldered to copper layer 48, while the other half of the devices (e.g., low-side devices) are directly soldered to copper layer 50. Conductive spacers are used for soldering between conductive portions of the IGBT or diode dies directly soldered on one substrate to the circuit pattern on the other substrate as known in the art. Signal pins for the gate drive signals and kelvin emitter signals are soldered to respective pads, and power pins are soldered to respective pads for the positive rail DC+, negative rail DC−, and the output AC. Portions of the assembly can be potted by an insulating body, with the power/signal pins and heat transfer layers exposed. Although the structure in FIG. 4 is relatively compact in size, the common source inductance is not enhanced by the illustrated layout.

FIGS. 5-13 show a preferred embodiment of the invention wherein the etched copper circuit pattern layer on the DBC substrates incorporate special patterns to direct a main power current flow to create areas with high magnetic flux density (e.g., indented notches in the conductive plates as described below). The traces for the gate drive loops (e.g., the traces interconnecting gate drive pins g1-e1 or g2-e2 to the respective transistor dies) include respective winding coils etched in the DBC copper layer so that the windings surround respective high magnetic flux areas created by the power loops to enhance the common source inductance. The winding areas can be adjusted flexibly to achieve the desired common source inductance. The windings in the gate loop for upper and lower devices can be on the same DBC substrate or on different DBC substrates (e.g., one is on bottom DBC and one is on top DBC). Preferably, the high-side and low-side power loops concentrate their magnetic flux in the same area and the two gate windings both surround that same area in order to save the space.

Figure 5:
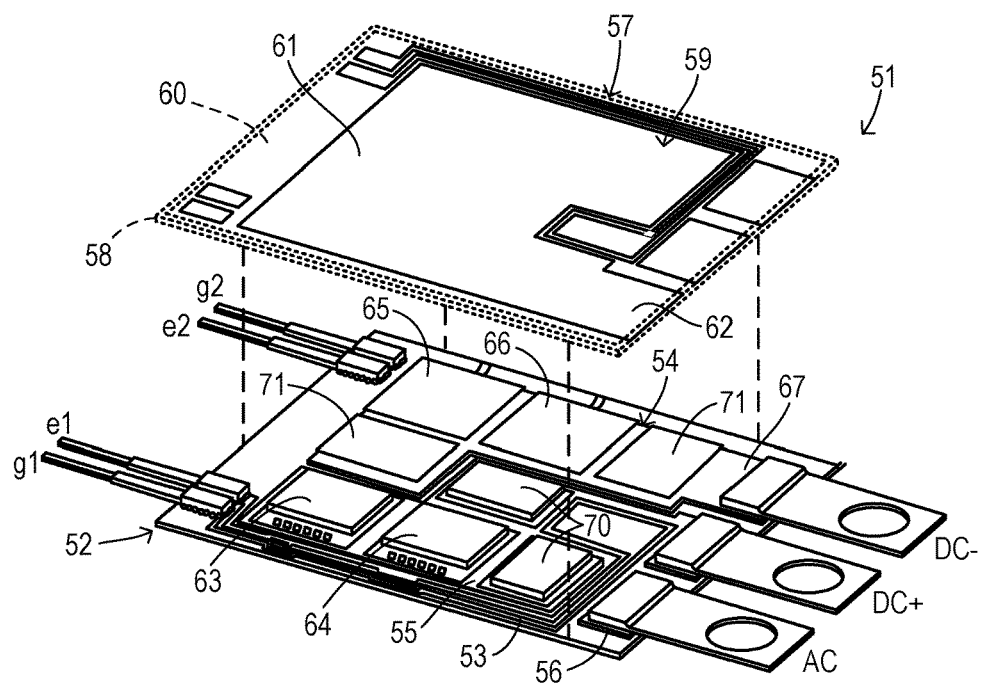
FIG. 5 is an exploded, perspective view of a layout for a half-bridge power module using two parallel transistors each for switching the high-side and low-side of the half bridge and having an enhanced common source inductance, according to a first embodiment of the invention.

Referring to FIG. 5, half-bridge power module 51 has a first direct bonded copper (DBC) substrate 52 with a first insulation layer 53, a first etched circuit layer 54 on an inner surface, and a first heat transfer layer (not shown) on an outer surface. First etched circuit layer 54 includes a high-side plate 55 with a high-side terminal pad 56. A second DBC substrate 57 has a second insulation layer 58, a second etched circuit layer 59 on an inner surface, and a second heat transfer layer 60 on an outer surface. Second etched circuit layer 59 includes an output plate 61 with a output terminal pad 62. High-side transistor dies 63 and 64 have their collector sides soldered to high-side plate 55 (see FIG. 6). Low-side transistor dies 65 and 66 have their collector sides soldered to output plate 61. The emitter sides (not shown) of dies 65 and 66 are connected to a low-side plate 67 in first circuit layer 54 via soldered spacers (not shown). Spacers 68 and 69 are soldered between the emitter sides of transistor dies 63 and 64 and output plate 61, respectively. Dies 70 are the high-side diodes and dies 71 are the low-side diodes.

Figure 6:
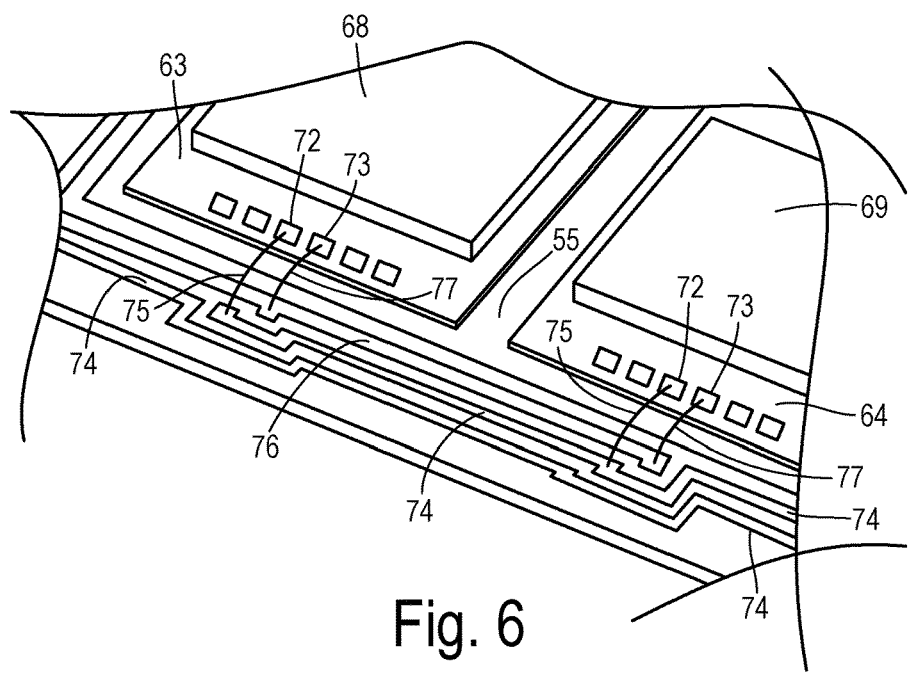
FIG. 6 is an enlarged section of the module of FIG. 5 showing connection to the gate traces in greater detail.

As best seen in FIG. 6, the emitter sides of transistor dies 63 and 64 have various input/output pads including gate pads 72 and kelvin emitter pads 73. Gate pads 72 are connected to one end of a gate trace 74 by bonding wires 75, and kelvin emitter pads 73 are connected to one end of a kelvin emitter trace 77. Gate trace 74 has an opposite end leading to gate terminal pin g1, and kelvin emitter trace 77 has an opposite end leading to kelvin emitter pin e1.

Figure 9:
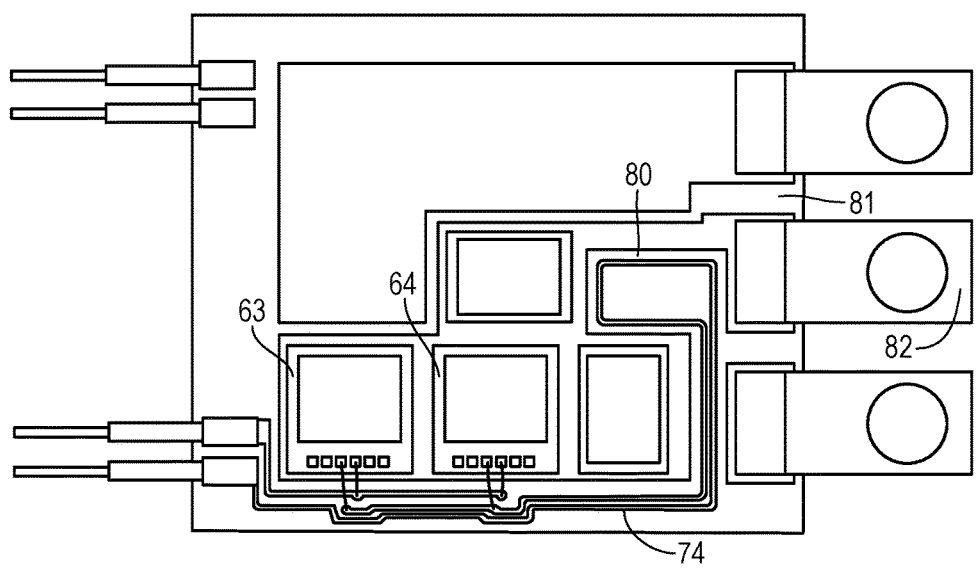
FIGS. 9 and 10 are top and bottom plan views, respectively, of the bottom DBC substrate of FIG. 5.
Figure 11:
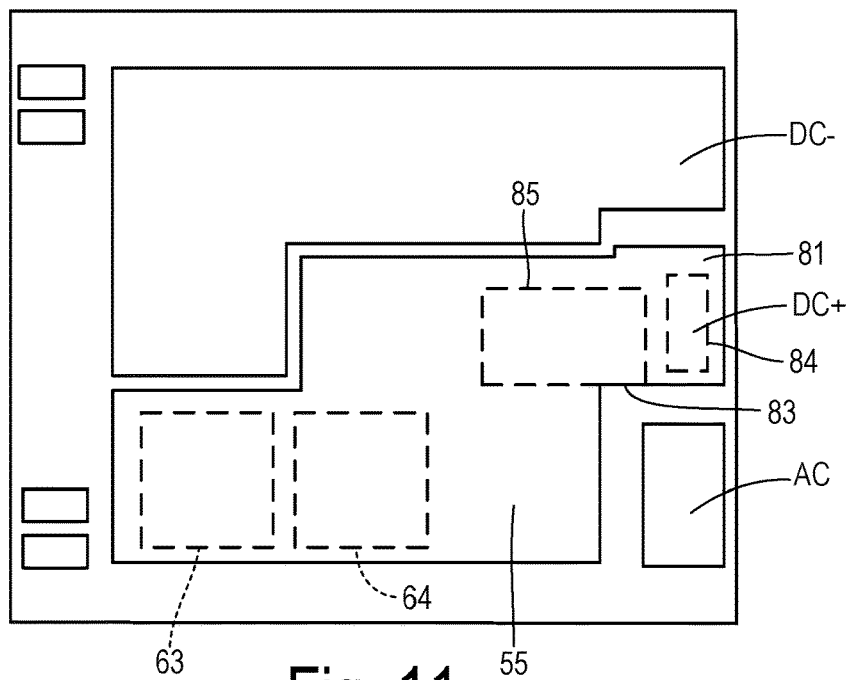
FIG. 11 is a top plan view of the bottom DBC substrate illustrating the placement of the indented notch within a high-side plate of the etched circuit layer for concentrating a magnetic flux.
Figure 12:
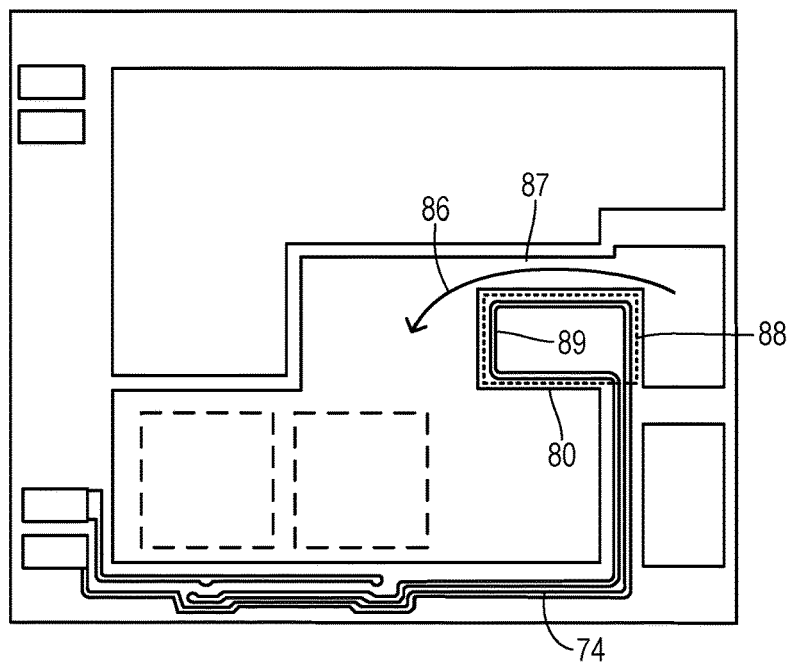
FIG. 12 is a top plan view of the bottom DBC substrate illustrating current flow around the indented notch and the placement of the gate trace within the indented notch.

As best seen in FIG. 9, high-side plate 55 defines a first indented notch 80 which is formed as an etched-away region along a perimeter edge of high-side plate 55. In particular, notch 80 is disposed between high-side transistor dies 63 and 64 and a high-side terminal pad 81 (which connects to a DC+ power pin 82), so that a magnetic flux induced by a current in the high-side plate flowing alongside notch 80 is concentrated in the region of notch 80. FIG. 11 shows a simplified diagram wherein high-side plate 55 has a boundary shown by a solid line 83, which includes pad 81 and a relatively wide conductive area between pad 81 and the locations where transistor dies 63 and 64 are mounted. A dashed box 84 shows where power pin 82 is soldered in place. A dashed box 85 shows a preferred area for forming the indented notch as an incursion into the wide conductive area that would otherwise carry the current flow for the high-side power loop. As shown in FIG. 12, the formation of notch 80 results in a concentrated current flow 86 through a narrowed bridging plate section 87. Current flow 86 curls to some degree around notch 80, causing a concentrated magnetic flux region 88. High-side gate trace 74 has an intermediate portion forming a coil loop 89 overlapping (e.g., disposed within) indented notch 80. Locating loop 89 within the concentrated magnetic flux enhances the common source inductance while consuming only a small amount of space for the notch and additional portion of the gate trace.

Figure 8:
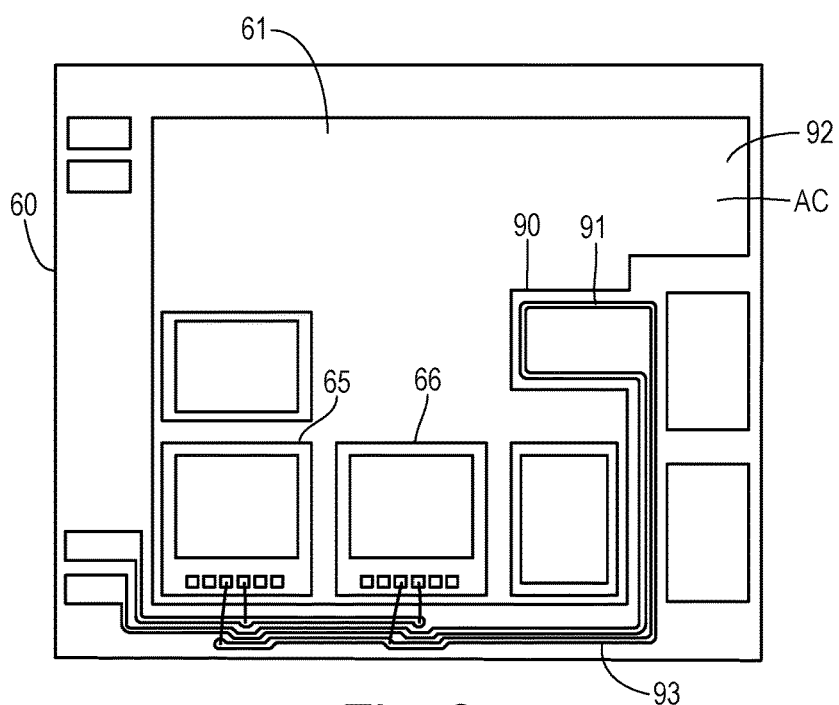
Figure 13:
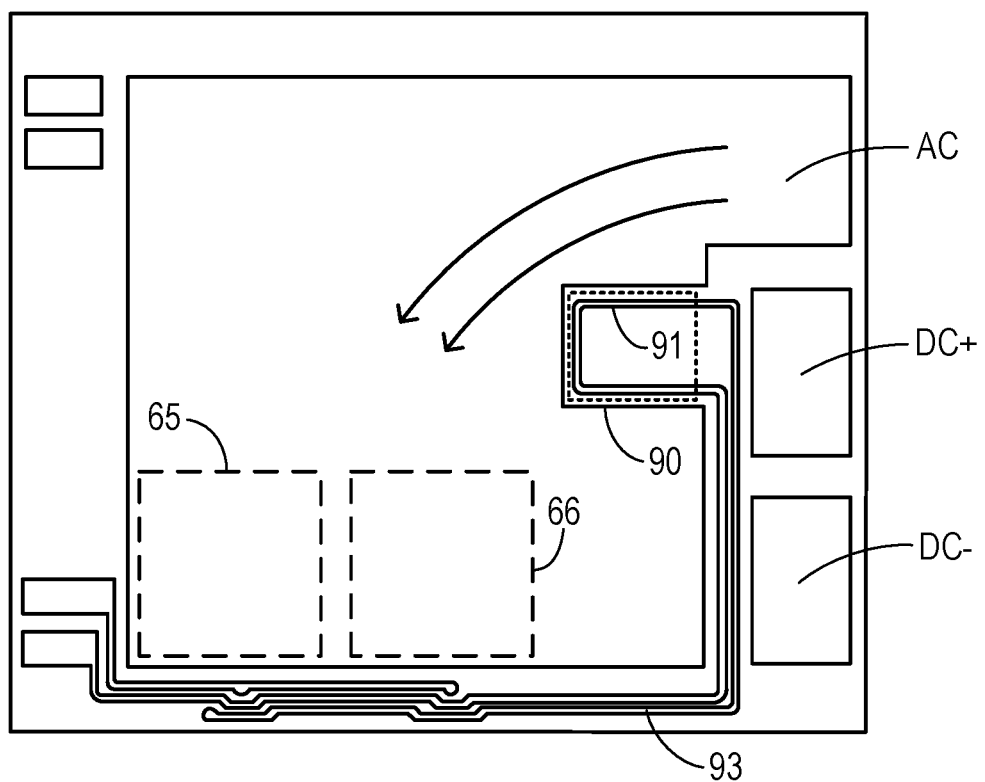
FIG. 13 is a bottom plan view of the top DBC substrate illustrating current flow around the indented notch and the placement of the gate trace within the indented notch.

For the low-side devices, a similar notch for concentrating the low-side power current and a gate trace approaching the concentrated magnetic flux are likewise used. Preferably, a corresponding space on the other DBC substrate is used for these structures in order to minimize the impact on the overall size of the power module. FIG. 8 shows the circuit pattern side of DBC substrate 60. Output plate 61 includes an indented notch 90 between output pad 92 and the locations of low-side transistor dies 65 and 66. Notch 90 accommodates a coil loop 91 of low-side gate trace 93. The shifted power loop current and concentrated magnetic flux within notch 90 are shown in FIG. 13.

After assembly, notches 80 and 90 and gate coil loops 89 and 91 are overlapping. Since the high-side and low-side are not conducting simultaneously, there is little interaction as a result of the common location.

The copper heat transfer layers on the external sides of the DBC substrates are typically continuous layers over substantially all of the insulating layer. However, with the concentrated magnetic flux that results from the formation of the indented notches, an increased level of Eddy currents may be induced in the heat transfer layers, which would oppose the magnetic flux and reduce the enhancement of the common source inductance. In order to reduce the Eddy currents, each heat transfer layer preferably has an etched pattern that creates a respective void which overlaps with the respective notch on the opposite side of the substrate. Since the concentrated magnetic flux within the notch on the circuit side does not cross the copper heat transfer layer, it is less effective at creating any Eddy currents. The void may also include a gap that extends to the edge of the heat transfer layer to break up the conductive path that would otherwise encircle the void. Thus, heat transfer layer 60 on insulating layer 58 in FIG. 7 has a etched void with a notch 94 that overlaps with notch 90 and an open gap 95 to prevent any circulating current around notch 94. Similarly, insulating layer 53 of DBC substrate 52 has a heat transfer layer 96 on its external side. Layer 96 forms a notch 97 overlapping with notch 80. A gap 98 breaks continuity around notch 97 so that Eddy currents cannot form.

Figure 14:
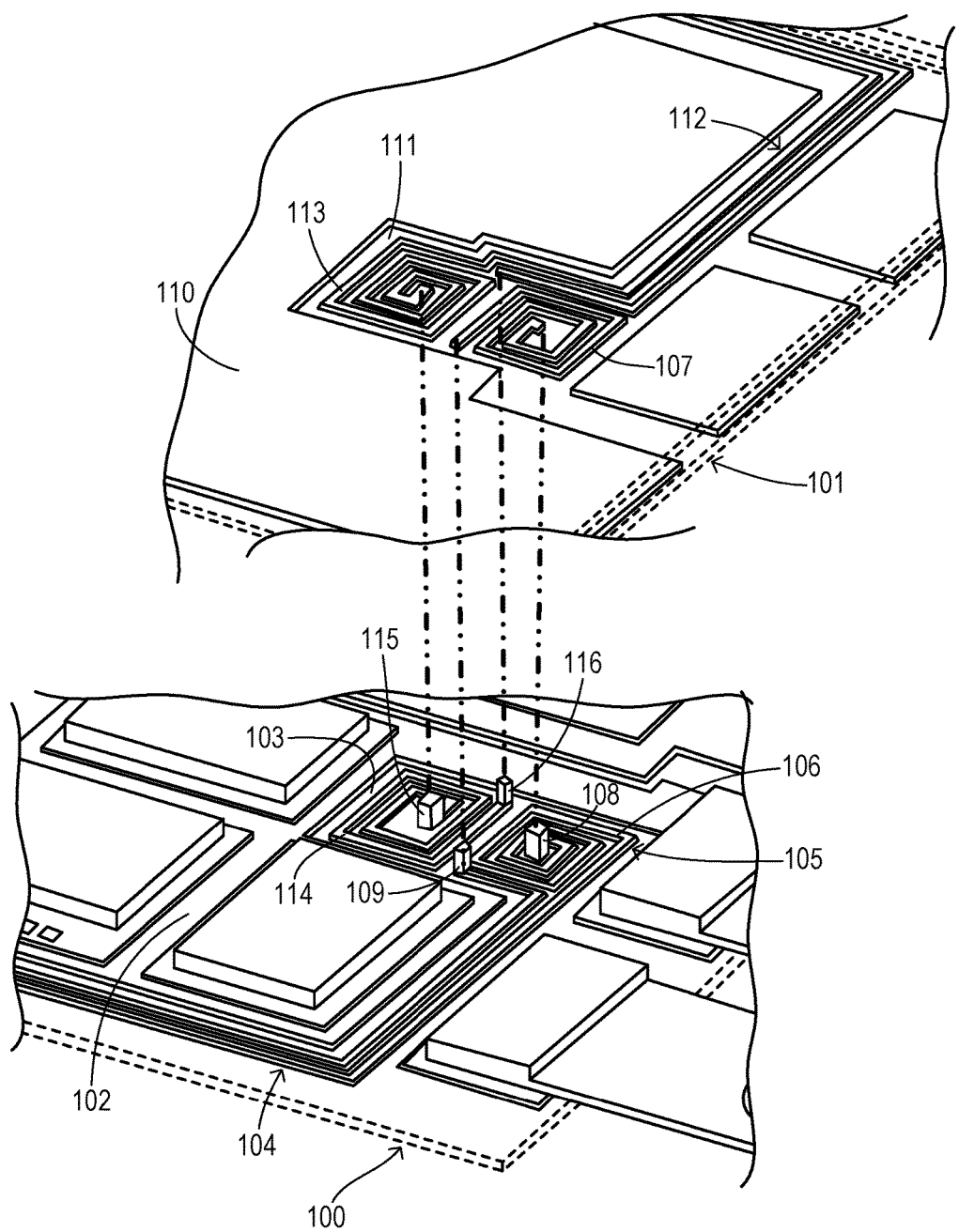
FIG. 14 is an exploded, perspective view of a layout for a half-bridge power module using two parallel transistors each for switching the high-side and low-side of the half bridge and having an enhanced common source inductance, according to another embodiment of the invention wherein the gate traces define a plurality of coil turns.

FIG. 14 shows an embodiment of the invention wherein the traces for the gate drive loops include respective winding coils etched in the DBC copper layers such that each coil includes more than one winding turn. The use of multiple winding turns prompts a need for the traces of a gate loop to "cross over" in order to avoid being trapped on the twodimensional surface of the substrate by leaving the surface for at least part of the gate traces. FIG. 14 shows an embodiment using a bottom DBC substrate 100 and a top DBC substrate 101 to each carry portions of gate winding turns for gate traces of the high-side and low-side IGBTs. Thus, bottom substrate 100 has a high-side plate 102 with a notch 103 to receive a gate trace 104. A coil winding 105 for a high-side gate loop has a bottom winding section 106 on DBC substrate 100 and a top winding section 107 on DBC substrate 101. Bottom winding section 106 spirals inwardly from the portion of gate trace 104 that extends to the IGBT gate bonding pads (not shown). At an inner end of the spiral, a spacer 108 is soldered on one side to the inner spiral end of section 106. The other end of spacer 108 is soldered to an inner spiral end of top winding section 107. From there, winding section 107 spirals outwardly, and its outer spiral end is soldered to one side of a spacer 109. The other side of spacer 109 is soldered to a return portion of gate trace 104. Because of the ability to include numerous winding turns in the gate loop, a larger enhancement of the common source inductance can be obtained.

On DBC substrate 101, an output plate 110 with a notch 111 to receive a gate trace 112. A coil winding for a low-side gate loop has a top winding section 113 on DBC substrate 101 and a bottom winding section 114 on DBC substrate 100. Top winding section 113 spirals inwardly from the portion of gate trace 112 that extends to the IGBT gate bonding pads (not shown). At an inner end of the spiral, a spacer 115 is soldered on one side to the inner spiral end of section 113. The other end of spacer 115 is soldered to an inner spiral end of bottom winding section 114. From there, winding section 114 spirals outwardly, and its outer spiral end is soldered to one side of a spacer 116. The other side of spacer 116 is soldered to a return portion of gate trace 112.

Figure 7:
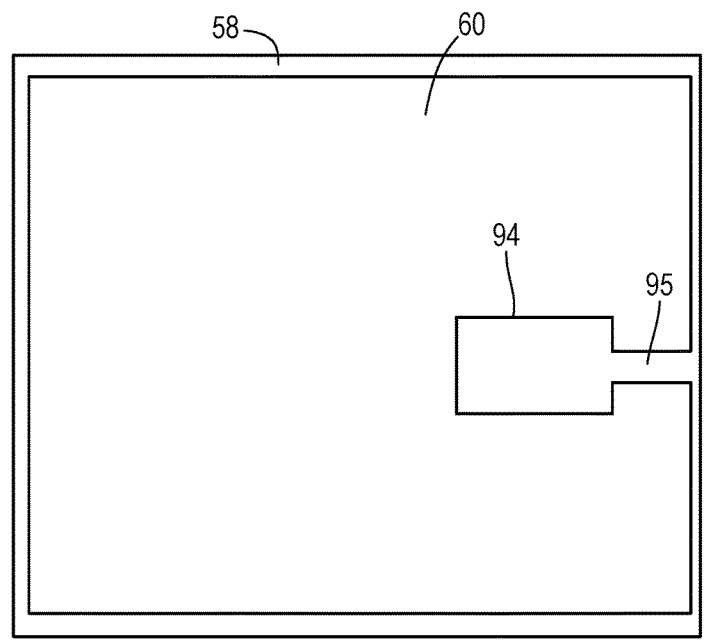
FIGS. 7 and 8 are top and bottom plan views, respectively, of the top DBC substrate of FIG. 5.
Figure 10:
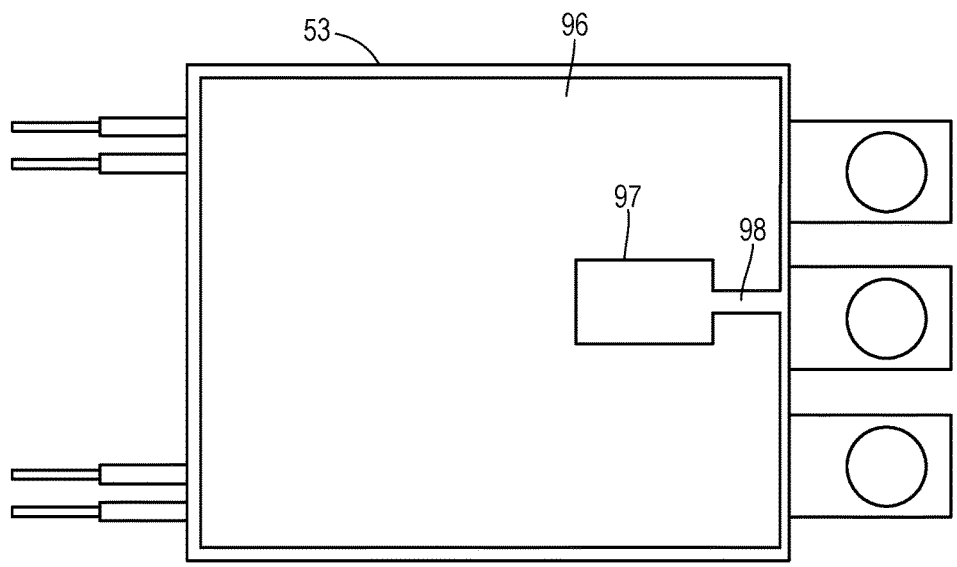

Like the embodiment of FIGS. 5-13, the embodiment of FIG. 14 minimizes space and avoids added circuit components while enabling enhancement of the common source inductance. The winding areas and number of coil turns can be adjusted flexibly to achieve the desired magnitude of common source inductance. Eddy current would still be a factor, so corresponding notches in the heat transfer layers as shown in FIGS. 7 and 10 would still be advantageous. A further reduction of the Eddy current effects is obtained by another embodiment shown in FIGS. 15 and 16, which utilizes the formation of the gate coils on both substrates to re-orient the coils' magnetic field directions to reduce interaction with the Eddy currents.

Figure 15:
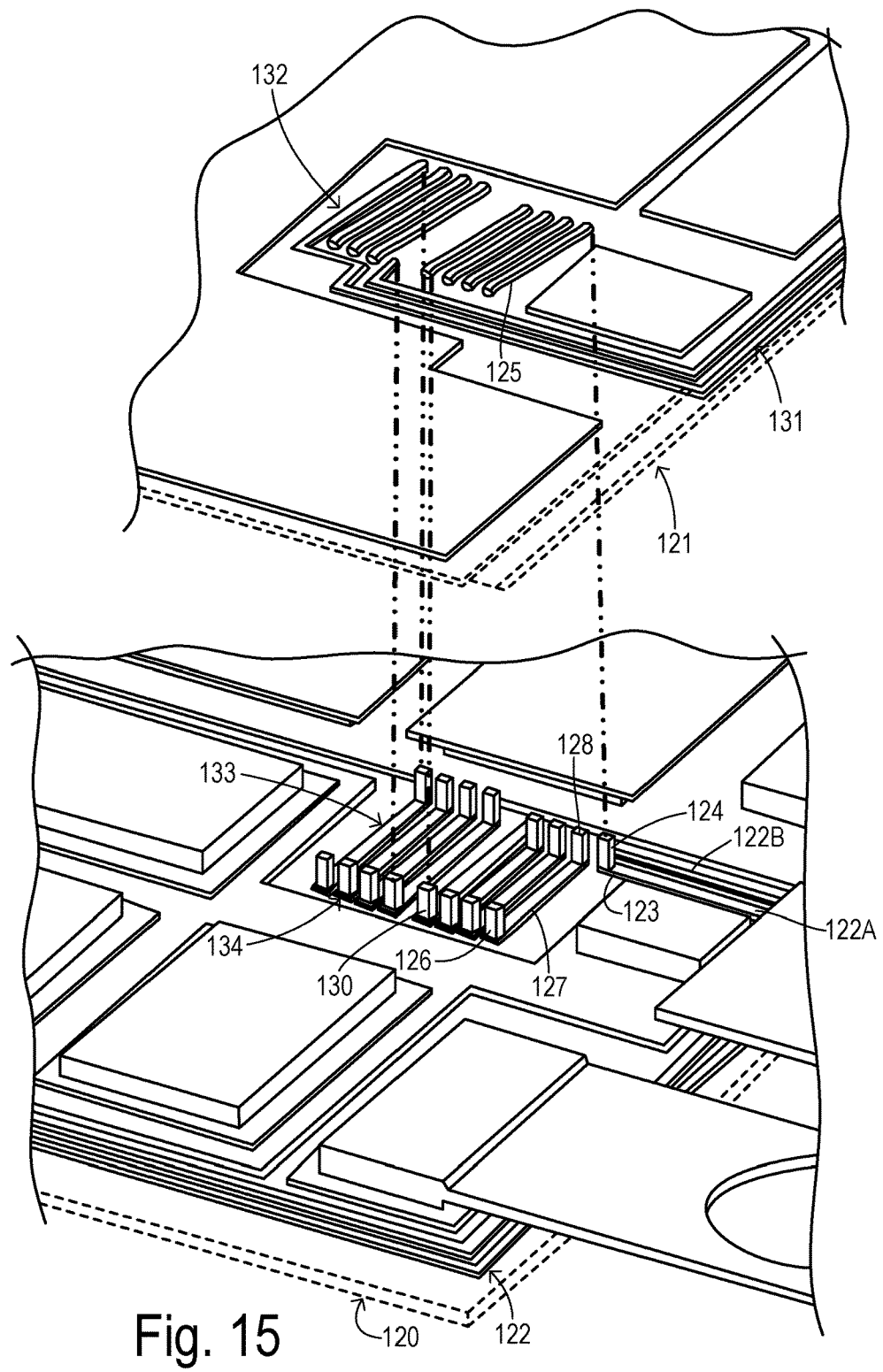
FIG. 15 is an exploded, perspective view of yet another embodiment wherein the gate traces define a plurality of coil turns such that the main magnetic flux direction is oriented parallel to the surfaces of the DBC substrates.
Figure 16:
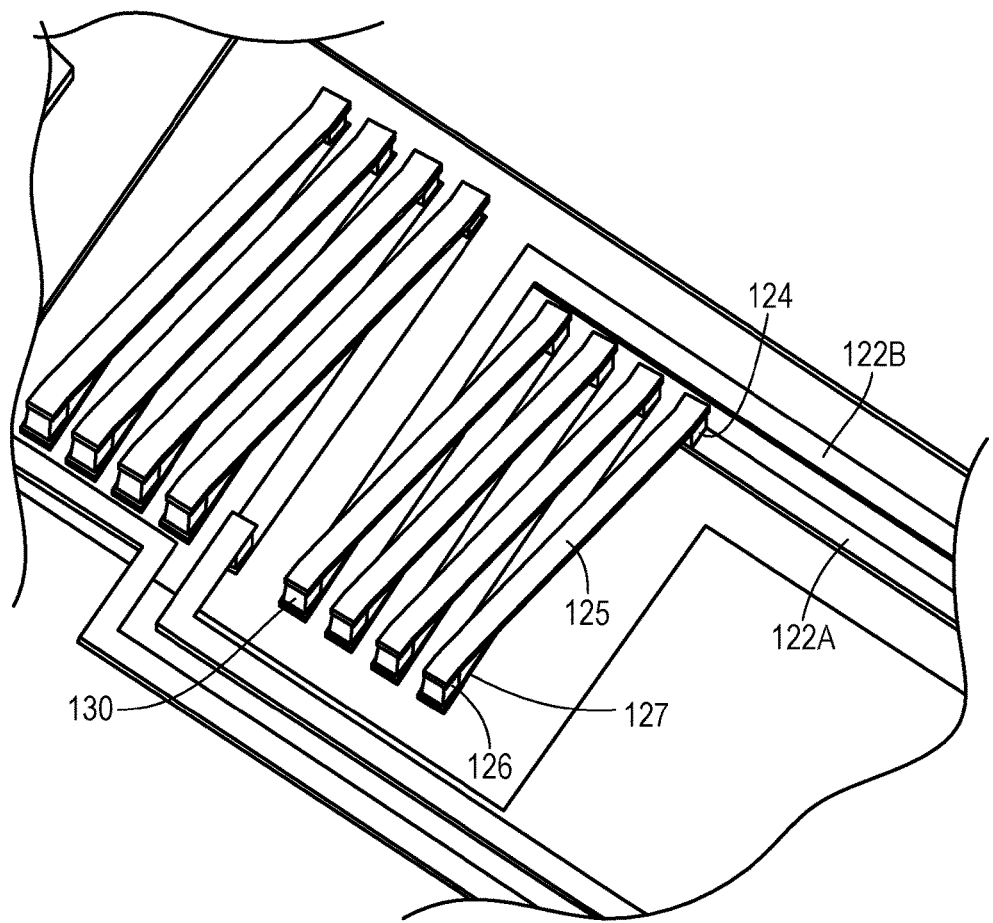
FIG. 16 is a perspective view of the gate traces defining the plurality of coil turns of FIG. 15 in greater detail.

As shown in FIGS. 15 and 16, a power module has a bottom DBC substrate 120 and a top DBC substrate 121. Gate trace 122 on bottom substrate 120 has segments 122A and 122B extending into a notch where a plurality of gate coil windings are formed. A spacer 124 is soldered from an end 123 of segment 122A to an end of a first link 125 on upper substrate 121. At the other end of link 125, a spacer 126 connects link 125 to a link 127 on bottom substrate 120. Similar links and spacers are arranged alongside the first, until a final spacer 130 connects to gate trace segment 122B. As a result of the layout of the gate coils, magnetic flux captured by the coils is parallel to the surface of substrates 120 and 121. The horizontal component of the magnetic flux generated by the power loop does not give rise to Eddy currents in the heat transfer layers. Therefore, the resulting common source inductance is not effected by the Eddy currents. In addition, another degree of design flexibility is achieved for obtaining a desired magnitude of the common source inductance since the inductance in this embodiment depends in part on the distance between the two substrates (which can be adjusted).

For the other one of the high-side or low-side IGBTs, gate traces 131 on substrate 121 are routed to a substantially identical gate coil with multiple winding turns which are formed using top links 132, bottom links 133, and a plurality of spacers 134.

What is claimed is:

1. A half-bridge power module comprising:
   a first direct bonded copper substrate (DBC) with a first insulation layer, a first etched circuit layer on an inner surface, and a first heat transfer layer on an outer surface, wherein the first etched circuit layer includes a high-side plate with a high-side terminal pad;
   a second direct bonded copper substrate (DBC) with a second insulation layer, a second etched circuit layer on an inner surface, and a second heat transfer layer on an outer surface, wherein the second etched circuit layer includes an output plate with a output terminal pad;
   a high-side transistor die having a collector side soldered to the high-side plate; and
   a low-side transistor die having a collector side soldered to the output plate;
   wherein the high-side plate defines a first indented notch disposed between the high-side transistor die and the high-side terminal pad to concentrate a magnetic flux at the first indented notch induced by a current in the high-side plate; and
   wherein one of the first or second etched circuit layers further includes a high-side gate trace connected to the high-side transistor die and overlapping the first indented notch.

2. The power module of claim 1 wherein the high-side gate trace follows a loop which receives at least a portion of the concentrated magnetic flux.

3. The power module of claim 2 wherein the high-side gate trace is included in the first etched circuit layer.

4. The power module of claim 2 wherein the output plate defines a second indented notch disposed between the low-side transistor die and the output terminal pad to concentrate a magnetic flux at the second indented notch induced by a current in the output plate; and
   wherein one of the first or second etched circuit layers further includes a low-side gate trace connected to the low-side transistor die and overlapping the second indented notch.

5. The power module of claim 4 wherein the low-side gate trace follows a loop which receives at least a portion of the concentrated magnetic flux of the second indented notch.

6. The power module of claim 5 wherein the low-side gate trace is included in the second etched circuit layer.

7. The power module of claim 5 wherein the second indented notch overlaps the first indented notch so that each notch concentrates magnetic flux into a common space.

8. The power module of claim 5 wherein each gate loop is comprised of a respective plurality of winding turns, and wherein each plurality of winding turns includes trace segments disposed in both the first and second etched circuit layers and a plurality of spacers joining the trace segments of the circuit layers.

9. The power module of claim 8 wherein the trace segments and spacers of each gate loop are arranged to capture a magnetic flux parallel to surfaces of the substrates.

10. The power module of claim 1 wherein the heat transfer layers each includes a respective void overlapping the first indented notch so that the concentrated magnetic flux does not cross the heat transfer layers.

11. An electric drive system for a vehicle, comprising:
a DC link between a pair of buses receiving a DC supply voltage from a power supply;
a traction motor; and
an inverter coupled between the DC link and the motor, the inverter comprising a plurality of power modules coupled between the buses in a bridge configuration to provide alternating power to a drive motor, each power module comprising:
a first direct bonded copper substrate (DBC) with a first insulation layer, a first etched circuit layer on an inner surface, and a first heat transfer layer on an outer surface, wherein the first etched circuit layer includes a high-side plate with a high-side terminal pad;
a second direct bonded copper substrate (DBC) with a second insulation layer, a second etched circuit layer on an inner surface, and a second heat transfer layer on an outer surface, wherein the second etched circuit layer includes an output plate with a output terminal pad;
a high-side transistor die having a collector side soldered to the high-side plate; and
a low-side transistor die having a collector side soldered to the output plate;
wherein the high-side plate defines a first indented notch disposed between the high-side transistor die and the high-side terminal pad to concentrate a magnetic flux at the first indented notch induced by a current in the high-side plate; and
wherein one of the first or second etched circuit layers further includes a high-side gate trace connected to the high-side transistor die and overlapping the first indented notch.

12. The electric drive system of claim 11 wherein the high-side gate trace follows a loop which receives at least a portion of the concentrated magnetic flux.

13. The electric drive system of claim 12 wherein the high-side gate trace is included in the first etched circuit layer.

14. The electric drive system of claim 12 wherein the output plate defines a second indented notch disposed between the low-side transistor die and the output terminal pad to concentrate a magnetic flux at the second indented notch induced by a current in the output plate; and
wherein one of the first or second etched circuit layers further includes a low-side gate trace connected to the low-side transistor die and overlapping the second indented notch.

15. The electric drive system of claim 14 wherein the low-side gate trace follows a loop which receives at least a portion of the concentrated magnetic flux of the second indented notch.

16. The electric drive system of claim 14 wherein the low-side gate trace is included in the second etched circuit layer.

17. The electric drive system of claim 14 wherein the second indented notch overlaps the first indented notch so that each notch concentrates magnetic flux into a common space.

18. The electric drive system of claim 14 wherein each gate loop is comprised of a respective plurality of winding turns, and wherein each plurality of winding turns includes trace segments disposed in both the first and second etched circuit layers and a plurality of spacers joining the trace segments of the circuit layers.

19. The electric drive system of claim 14 wherein the trace segments and spacers of each gate loop are arranged to capture a magnetic flux parallel to surfaces of the substrates.

20. The electric drive system of claim 11 wherein the heat transfer layers each includes a respective void overlapping the first indented notch so that the concentrated magnetic flux does not cross the heat transfer layers.

* * * * *